United States Patent
Yu

(10) Patent No.: US 9,613,868 B2
(45) Date of Patent: Apr. 4, 2017

(54) FIN FIELD-EFFECT TRANSISTORS AND FABRICATION METHODS THEREOF

(71) Applicant: Semiconductor Manufacturing International (Shanghai) Corporation, Shanghai (CN)

(72) Inventor: Guobin Yu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/837,370

(22) Filed: Aug. 27, 2015

(65) Prior Publication Data
US 2016/0064379 A1  Mar. 3, 2016

(30) Foreign Application Priority Data
Sep. 3, 2014  (CN) .......................... 2014-10445807

(51) Int. Cl.
*H01L 21/311*  (2006.01)
*H01L 21/3205*  (2006.01)
(Continued)

(52) U.S. Cl.
CPC .. *H01L 21/823431* (2013.01); *H01L 21/0214* (2013.01); *H01L 21/0217* (2013.01);
(Continued)

(58) Field of Classification Search
CPC ............. H01L 27/0886; H01L 29/7848; H01L 21/31144; H01L 21/31111; H01L 21/0217; H01L 21/0214; H01L 29/165; H01L 21/0223; H01L 21/31116; H01L 21/02164; H01L 21/823431; H01L 21/823468; H01L 29/66795; H01L 29/785; H01L 21/823821; H01L 27/0924; H01L 21/3086; H01L 21/823418
(Continued)

(56) References Cited

U.S. PATENT DOCUMENTS 7,745,871 B2 *  6/2010  Oh ..................... H01L 29/66553
257/314
8,664,060 B2 *  3/2014  Liu ................... H01L 29/66795
257/255
(Continued)

*Primary Examiner* — Shouxiang Hu
(74) *Attorney, Agent, or Firm* — Anova Law Group, PLLC

(57) ABSTRACT

A method for forming FinFETs includes, sequentially, providing a substrate; forming a plurality of fins on a surface of the substrate; forming a gate structure overlying on at least one of the plurality of fins; forming a barrier layer covering top and side surfaces of the gate structures, and top and side surfaces of the plurality of fins; performing a radical oxidation process to convert a top portion of the barrier layer to a passive layer to form a remaining barrier layer and to cause the top surfaces of the fins to be flat after subsequent etching processes; performing an etch-back process on the passive layer to form passive sidewalls on side surfaces of the portions of the remaining barrier on the side surfaces of the fins; and removing portions of the remaining barrier layer on the top surfaces of the fins by a wet etching process using the passive sidewalls as an etching mask.

18 Claims, 6 Drawing Sheets

(51) Int. Cl.
*H01L 29/76* (2006.01)
*H01L 21/8234* (2006.01)
*H01L 21/02* (2006.01)
*H01L 29/165* (2006.01)
*H01L 27/088* (2006.01)
*H01L 29/78* (2006.01)

(52) U.S. Cl.
CPC .... *H01L 21/0223* (2013.01); *H01L 21/02164* (2013.01); *H01L 21/31111* (2013.01); *H01L 21/31116* (2013.01); *H01L 21/31144* (2013.01); *H01L 21/823468* (2013.01); *H01L 27/0886* (2013.01); *H01L 29/165* (2013.01); *H01L 29/7848* (2013.01)

(58) Field of Classification Search
USPC ............... 438/283, 199, 595, 696, 300, 770; 257/401, 288
See application file for complete search history.

(56) References Cited

U.S. PATENT DOCUMENTS

| | | | |
|---|---|---|---|
| 8,796,695 B2 * | 8/2014 | Liao .................. | H01L 29/66484 257/190 |
| 8,865,596 B2 * | 10/2014 | Johnson .............. | H01L 21/3086 438/157 |
| 8,980,701 B1 * | 3/2015 | Lu ..................... | H01L 29/66795 438/151 |

\* cited by examiner

FIN FIELD-EFFECT TRANSISTORS AND FABRICATION METHODS THEREOF

CROSS-REFERENCES TO RELATED APPLICATIONS

This application claims the priority of Chinese patent application No. 201410445807.6, filed on Sep. 3, 2014, the entirety of which is incorporated herein by reference.

FIELD OF THE INVENTION

The present invention generally relates to the field of semiconductor manufacturing technology and, more particularly, relates to Fin field-effect transistors (FinFETs) and fabrication processes thereof.

BACKGROUND

With the continuous development of the semiconductor technology, the technical node of the semiconductor processes has become smaller and smaller by following the Moore's law. In order to match the requirements for decreasing the technical node, the channel length of MOSFETs has been continuously decreased. Decreasing the channel length of MOSFETs may bring some advantages, such as increasing the integration level, and increasing the switch speed of the MOSFETs, etc.

However, with the decreasing of the channel length of the semiconductor devices, the distance between the source regions of the semiconductor devices and the drain regions of the semiconductor devices is also correspondingly decreased. Thus, the control ability of the gate structures of the semiconductor devices to the channel regions become worse. That is, the pinch off of the channel regions of the semiconductor devices has become more and more difficult. Thus, the subthreshold leakage may be easy to happen. The subthreshold leakage is also referred as the short channel effects (SCEs).

In order to better match the requirements for device miniaturization, the semiconductor process has been gradually transferred from the planar MOSFETs to more efficient three-dimensional transistors, such as fin field-effect transistors (FinFETs), etc. In a FinFET, the gate structure is able to control the fin structure from two sides of the fin. Thus, comparing with a planar MOSFET, the control ability of the gate structure to the channel region may be stronger; and the SCEs may be effectively controlled. Further, comparing with other device structures, FinFETs may have a better compatibility with the existing manufacturing technology of integrated circuits.

With the continuous development of the semiconductor technology, the carrier mobility enhancement technology has attracted extensive research and applications in FinFETs. Increasing the carrier mobility of the channel regions of the FinFETs is able to increase the drive current of the FinFETs. Thus, the performance of the FinFETs may be improved.

Embedded silicon germanium (e-SiGe) method is one of the several approaches for increasing the carrier mobility of channel regions of the FinFETs. The SiGe structures embedded in the fins, or on the fins of the FinFETs are able to induce a compressive stress or a tensile stress in the channel regions of the FinFETS because of the crystal lattice mismatch between the substrate and the embedded SiGe structures. In a semiconductor device, a compressive stress or a tensile stress is able to change the bandgap and/or carrier mobility of the channel region. Thus, improving the performance of the FinFETs by the e-SiGe method has become a more and more common method. Specifically, by properly controlling the compressive stress or the tensile stress applied on channel regions of the FinFETs by the embedded SiGe structures, the carrier mobility of the channel regions of the FinFETs is increased. Thus, the drive current of the FinFETs is increased; and the performance of the FinFETs is enhanced. The carriers in NMOS FinFETs are electrons; and the carriers in PMOS FinFETs are holes.

However, the quality of embedded SiGe structures, are also referred as a stress layer, i.e., material layers applying the compressive stress or tensile stress to the channel regions of the FinFETs, formed by existing methods may not match desired requirements. Thus, the electrical properties of the FinFETs having such a stress layer may not match requirements neither. The disclosed device structures and methods are directed to solve one or more problems set forth above and other problems.

BRIEF SUMMARY OF THE DISCLOSURE

One aspect of the present disclosure includes a method for fabricating FinFETs. The method includes providing a substrate; and forming a plurality of fins on a surface of the substrate. The method also forming a gate structure overlying on at least one of the plurality of fins. Further, the method includes forming a barrier layer covering top and side surfaces of the gate structure, and top and side surfaces of the plurality of fins; and performing a radical oxidation process to convert a top portion of the barrier layer to a passive layer to form a remaining barrier layer and to cause the top surfaces of the fins to be flat after subsequent etching processes. Further, the method includes performing an etch-back process on the passive layer to form passive sidewalls on side surfaces of portions of the remaining barrier on the side surfaces of the fins; and removing the portions of the remaining barrier layer on the top surfaces of the fins by a wet etching process using the passive sidewalls as an etching mask.

Another aspect of the present disclosure includes a semiconductor structure having a plurality of FinFETs. The semiconductor structure includes a semiconductor substrate; and a plurality of fins formed on a surface of the substrate. The semiconductor structure barrier sidewalls formed on side surfaces of the fins. Further, the semiconductor structure includes a gate structure overlying on at least one of the plurality of fins; and stress layers formed on each of the plurality of fins at both sides of the gate structure. Wherein the barrier sidewalls are formed by, sequentially, forming a barrier layer covering top and side surfaces of the gate structure, and top and side surfaces of the plurality of fins; performing a radical oxidation process to convert a top portion of the barrier layer to a passive layer to form a remaining barrier layer and to cause the top surfaces of the fins to be flat after subsequent etching process; performing an etch-back process on the passive layer to form passive sidewalls; removing portions of the remaining barrier layer on the top surfaces of the fins; and removing the passive sidewalls.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
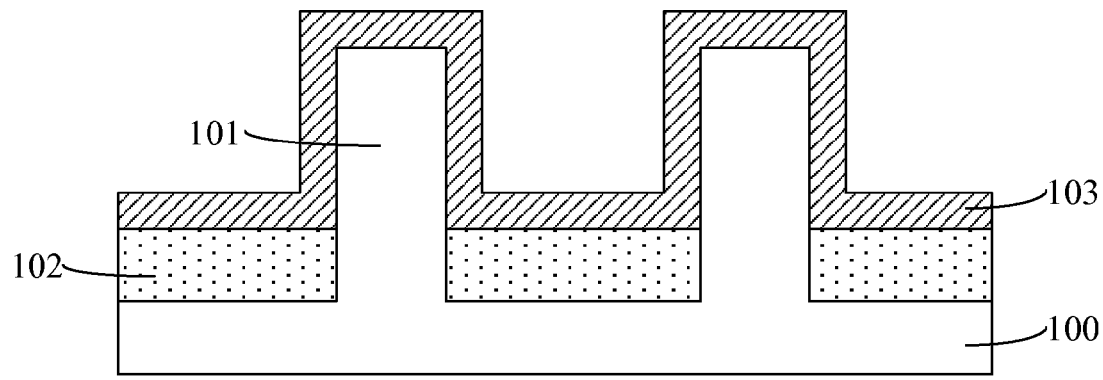
FIGS. 1-2 illustrate semiconductor structures corresponding to certain stages of an existing fabrication process of FinFETs.
Figure 2:
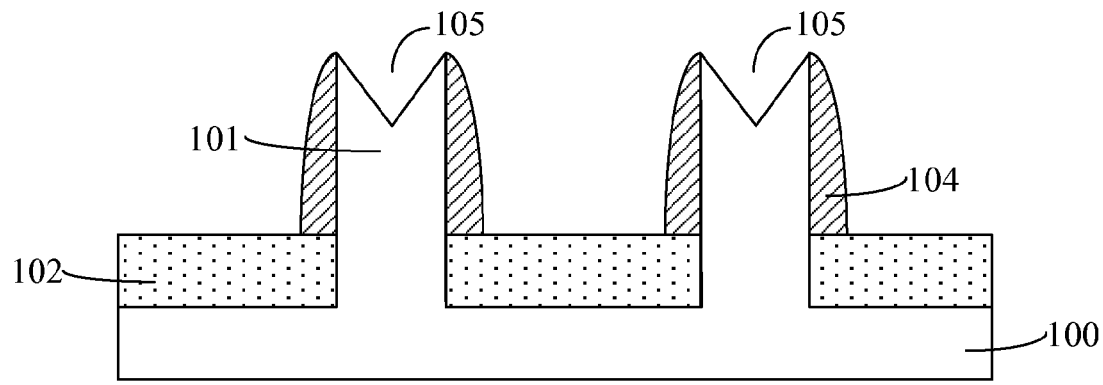

FIGS. 1-2 illustrate semiconductor structures corresponding to certain stages of an existing fabrication process of FinFETs. As shown in FIG. 1, the process includes providing substrate 100; forming a plurality of fins 101 on the substrate 100; and forming an insulation layer 102 on the substrate 100 between adjacent fins 101. The insulation layer 102 covers portions of the side surfaces of the fins 101. Further, the surface of the insulation layer 102 is lower than the top surfaces of the fins 101. The process also includes forming a barrier layer 103 covering the surface of the insulation layer 102, and the top and the side surfaces of the fins 101.

Further, as shown in FIG. 2, the process includes removing the portions of the barrier layer 103 on the surface of the insulation layer 102 and the top surfaces of the fins 101 by an etch-back process. Thus, sidewall spacers 104 is formed on the side surfaces of the fins 101; and the top surfaces of the fins 101 are exposed. The sidewall spacers 104 may be used to prevent the stress layers subsequently formed by an epitaxial growth process from being formed on the side surfaces of the fins 101 to cause a bridging issue.

The portions of the barrier layer 103 on the top surface of the Fins 301 may be removed by a dry etching process. Referring to FIG. 2, "V" shape trenches 105 may be formed on the top surfaces of the fins 101 after the dry etching process. When the portions of the barrier 103 on the top surfaces of the fins 101 is being removed, it may be difficult to control the stop position of the etching process. Thus, the top surfaces of the fins 101 may be over-etched. The side surfaces of the fins 101 may be covered by the sidewall spacers 104. Thus, the etching gas of the dry etching process near the sidewall spacers 104 may be blocked by the sidewall spacers 104; and the etching rate may decrease from the side surfaces of the fins 101 to the center regions of the fins 101 during the etching process. Therefore, the "V" shape trenches 105 may be formed in the top surfaces of the fins 101. The "V" shape trenches 105 may adversely affect the quality of the e-SiGe structures subsequently formed by an epitaxial growth process. Thus, the quality of the stress layers may not match the desired requirements. The e-SiGe structures may also be configured as the source/drain regions of the FinFETs. Thus, the performance of the FinFETs may also be adversely affected. According to the disclosed processes and device structures, the over-etching issue ("V" shape trenches) and other issues may be overcome by forming a passive layer on the barrier layer; and forming the sidewall spacers by a wet etching process.

Figure 11:
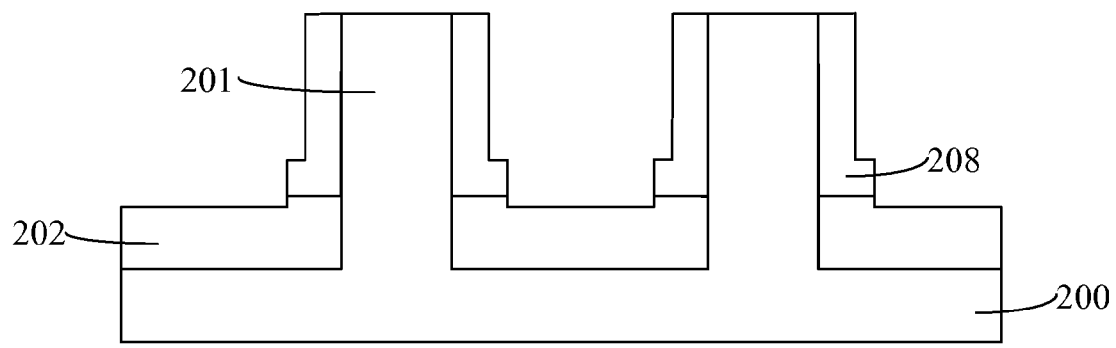
Figure 12:
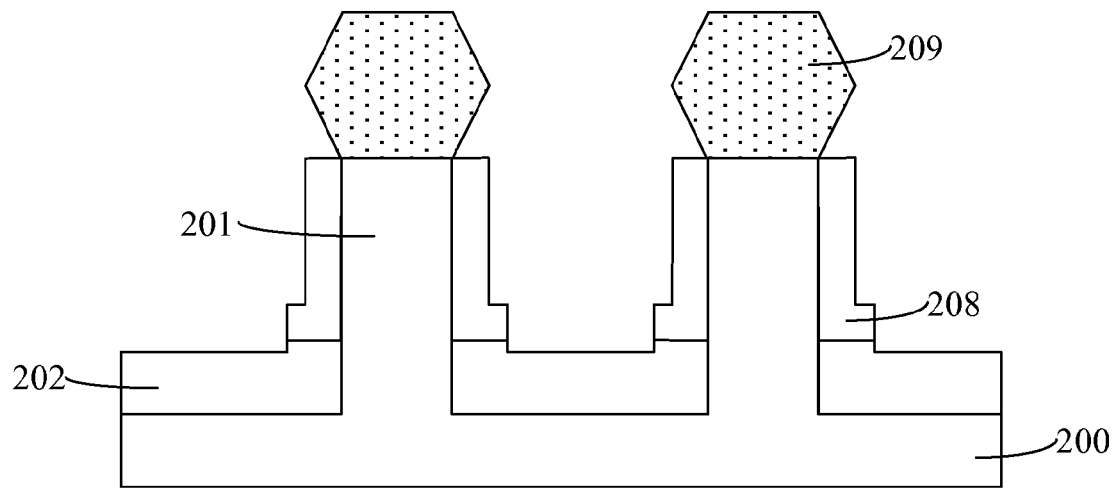
Figure 13:
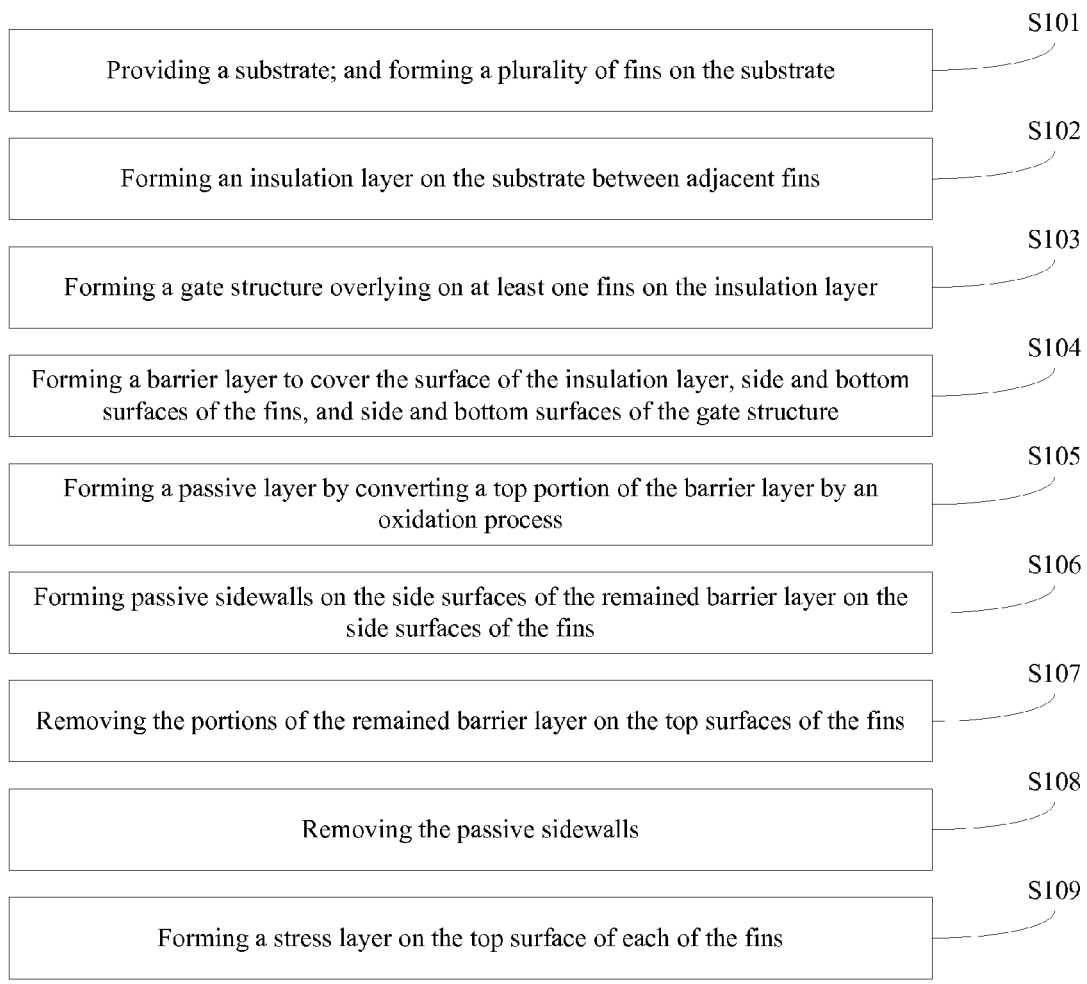
FIG. 13 illustrates an exemplary fabrication process of FinFETs consistent with the disclosed embodiments.

FIG. 13 illustrates an exemplary fabrication process of FinFETs consistent with the disclosed embodiments; and FIGS. 3-12 illustrate semiconductor structures corresponding to certain stages of the exemplary fabrication process.

Figure 3:
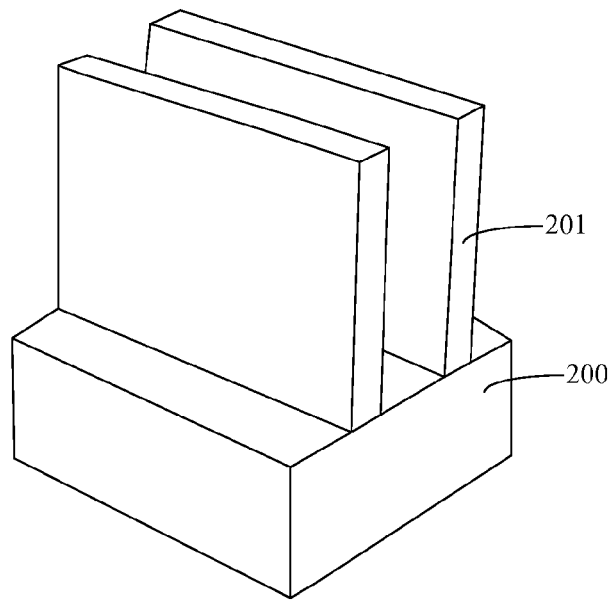
FIGS. 3-12 illustrate semiconductor structures corresponding to certain stages of an exemplary fabrication process of FinFETs consistent with the disclosed embodiments.

As shown in FIG. 13, at the beginning of the fabrication process, a substrate with certain structures is provided (S101). FIG. 3 illustrates a corresponding semiconductor structure.

As shown in FIG. 3, a substrate 200 is provided. Further, a plurality of fins 201 are formed on the substrate 200.

The substrate 200 may be made of any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor, or a combination thereof. The substrate 200 provides a base for subsequent devices and processes.

In one embodiment, the substrate 200 is made of silicon. Thus, the cost of the FinFETs may be reduced. Further, the substrate 200 made of silicon may be compatible with the existing fabrication processes of planar transistors.

Further, P-type wells and/or N-type wells may be formed in the substrate 200. If the FinFETs are NMOS devices, P-type wells may be formed in the substrate 200. If the FinFETs are PMOS devices, N-type wells may be formed in the substrate 200.

Further, a threshold adjusting ion implantation process may be performed on the substrate 200. After the threshold adjusting ion implantation process, a thermal annealing process may be performed to activate the doping ions. The doping ions may be used to adjust the threshold voltage of the FinFETs.

The fins 201 may be formed by etching an initial substrate to form the protruding fins 201 on the surface of the substrate 200. In certain other embodiments, the fins 201 may be formed by forming a semiconductor epitaxial layer on the surface of the substrate 200; and followed by etching the semiconductor epitaxial layer. The semiconductor epitaxial layer may be made of any appropriate semiconductor material, such silicon, germanium, or silicon germanium, etc. In one embodiment, the semiconductor epitaxial layer is made of single crystal silicon.

In one embodiment, a process for forming the plurality of fins 201 may include, sequentially, providing an initial substrate; forming a patterned mask layer defining the position of the subsequently formed fins 201 on the initial substrate; and etching the initial substrate to a predetermined depth using the patterned mask layer an etching mask. Thus, the initial substrate may be formed into the substrate 200 and the plurality of fins 201.

Therefore, the substrate 200, the initial substrate, and the plurality of fins 201 may be made of a same semiconductor material. Various processes may be used to etch the initial substrate, such as a dry etching process, a wet etching process, or an ion beam etching process, etc. In one embodiment, a reactive ion etching (RIE) process is used to etch the initial substrate to form the substrate 200 and the plurality of fins 201.

In certain other embodiments, the plurality of fins 201 are formed by a double patterning process. Specifically, the double patterning process for forming the plurality of fins 201 may include, sequentially, providing an initial substrate; forming a patterned sacrificial layer on the initial substrate; forming a sidewall film on the surface of the initial substrate and the patterned sacrificial layer; performing an etch back process on the sidewall film to form sidewall spacers; removing the sacrificial layer; and etching the initial substrate using the sidewall spacers as an etching mask to a predetermined depth. Thus, the plurality of fins 201 may be formed on the substrate 200.

The number of the fins 201 may be more than one. For illustrative purposes, two fins 201 are described.

Figure 4:
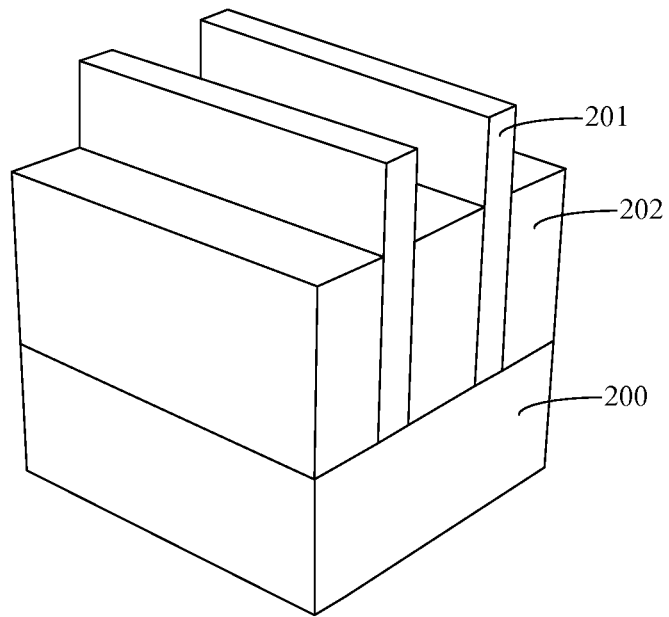

Returning to FIG. 13, after providing the substrate 200, and forming the plurality of fins 201, an insulation layer may be formed (S102). FIG. 4 illustrates a corresponding semiconductor structure.

As shown in FIG. 4, an insulation layer 202 is formed on the surface of the substrate 200 between adjacent fins 201. The top surface of the insulation layer 202 may be lower than the top surfaces of the fins 201.

The insulation layer 202 may be made of any appropriate insulation material, such as silicon oxide, silicon nitride, or silicon oxycarbide, etc. The insulation layer 202 may be used to insulate adjacent fins 201. The insulation layer 202 may also be used to insulate the substrate 200 and the subsequently formed gate structure.

A process for forming the insulation layer 202 may include forming an insulation film (not labeled) on the substrate 200. The insulation film may cover the fins 201 and fill the trenches between adjacent fins 201. The process may also include planarizing the insulation film using the top surfaces of the fins 201 as a polishing stop layer. After the planarization process, the top surface of the insulation film may level with the top surfaces of the fins 201. Further, the process may include performing an etch-back process on the planarized insulation film to cause the top surface of the insulation film to be lower than the top surfaces of the fins 201. Thus, the insulation layer 202 with a top surface lower than the top surfaces of the fins 201 may be formed.

The insulation film may be formed by any appropriate processes, such as a chemical vapor deposition (CVD) process, a physical vapor deposition (PVD) process, an atomic layer deposition (ALD) process, or a flowable CVD (FCVD) process, etc. The planarization process may include any appropriate process, such as a chemical mechanical polishing (CMP) process, a physical mechanical polishing process, or an ion beam polishing process, etc. In one embodiment, a CMP process is used to planarize the insulation film. The etch-back process may be any appropriate process, such as a dry etching process, or a wet etching process.

Figure 5:
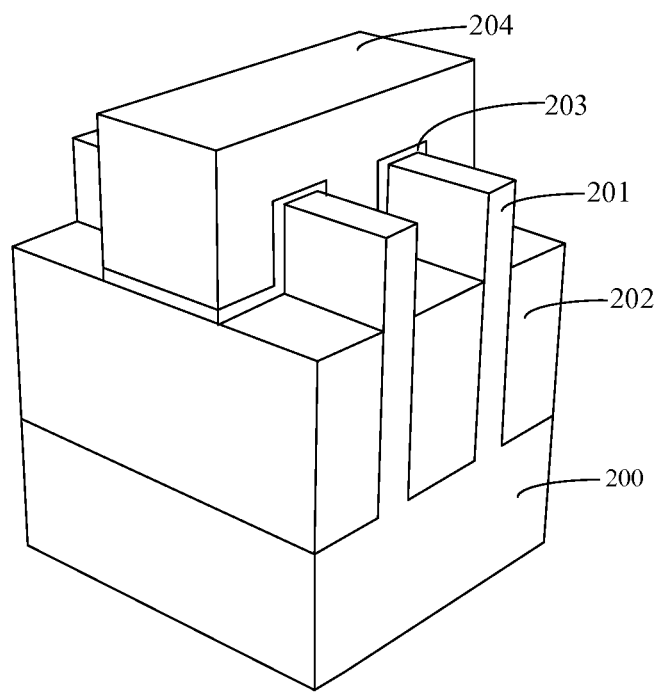

Returning to FIG. 13, after forming the isolation layer 202, a gate structure may be formed (S103). FIG. 5 illustrates a corresponding semiconductor structure.

As shown in FIG. 5, a gate structure overlying on at least one of the plurality of fins 201 is formed on the surface of the insulation layer 202. The gate structure covers portions of the side and top surfaces of the fins 201. The gate structure may include a gate dielectric layer 203 formed on the insulation layer 202, and the portions of the side and top surfaces of the fins 201; and a gate electrode layer 204 formed on the gate dielectric layer 203.

In one embodiment, the gate structure is a metal gate structure. The gate dielectric layer 203 may be made of any appropriate high dielectric constant (high-K) material, such as HfO, ZrO, AlO, HfSiO, ZrSiO, etc. The high-K material may refer to the material with a dielectric constant greater than the dielectric constant of silicon oxide. The gate electrode layer 204 may be made of any appropriate material, such as Al, W, Ti, TiN, Ta, or TaN, etc. Such a metal gate structure may be used as the gate structure of the FinFETs.

In certain other embodiments, the gate structure is a polysilicon gate structure. The gate dielectric layer 203 may be made of silicon oxide. The gate electrode layer 204 is made of polysilicon, or doped polysilicon.

In still certain other embodiments, the gate structure is a dummy gate structure. The dummy gate structure includes a dummy gate dielectric layer and a dummy gate electrode layer formed on the dummy gate dielectric layer. The dummy gate dielectric layer and the dummy gate electrode layer may be made a same material, or different materials. In one embodiment, the dummy gate dielectric layer is made of silicon oxide; and the dummy gate electrode is made of polysilicon. A gate-last process may be used to subsequently form a metal gate structure by removing the dummy gate structure.

Referring to FIG. 5, the gate structure covers two fins 201. Thus, the channel area under the gate structure may be increased. In certain other embodiments, the gate structure may cover one, or two more fins 201.

A process for forming the gate structure may include forming a gate dielectric film on the surface of the insulation layer 202. The gate dielectric film may cover the surface of the insulation layer 202, and the side and top surfaces of the fins 201. The process may also include forming a gate electrode film on the surface of the gate dielectric film; and forming a patterned mask layer on the surface of the gate electrode film. Further, the process may include etching the gate electrode film and the gate dielectric film using the patterned mask layer as an etching mask. Thus, the gate structure overlying on the fins 201 may be formed. After forming the gate structure, the patterned mask layer may be removed.

The gate dielectric film may be formed by any appropriate process, such as a CVD process, a PVD process, an ALD process, or an FCVD process, etc. The gate electrode film may be formed by any appropriate process, such as a CVD process, a PVD process, an FCVD process, or an electroplating process, etc. Various processes may be used to etch the gate dielectric film and the gate electrode film, such as a dry etching process, or a wet etching process, etc.

The patterned mask layer may be a patterned photoresist layer, or a hard mask layer, etc. Various processes may be used to remove the patterned mask layer, such as a dry etching process, a wet etching process, or a plasma ashing process, etc.

Figure 6:
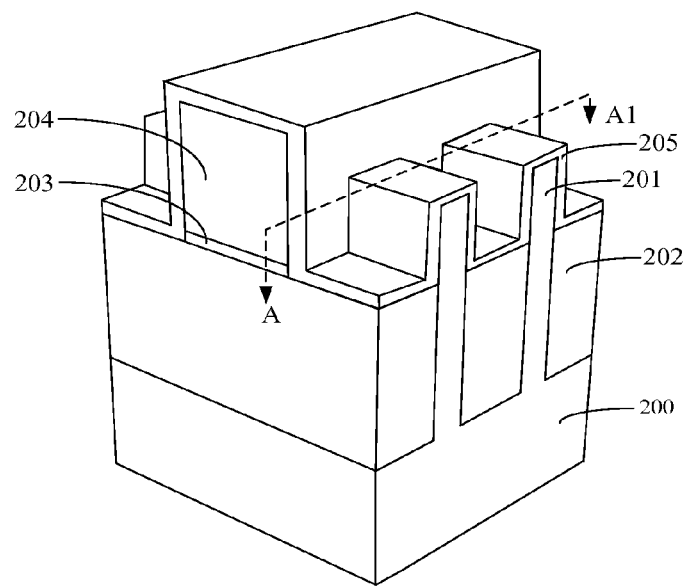
Figure 7:
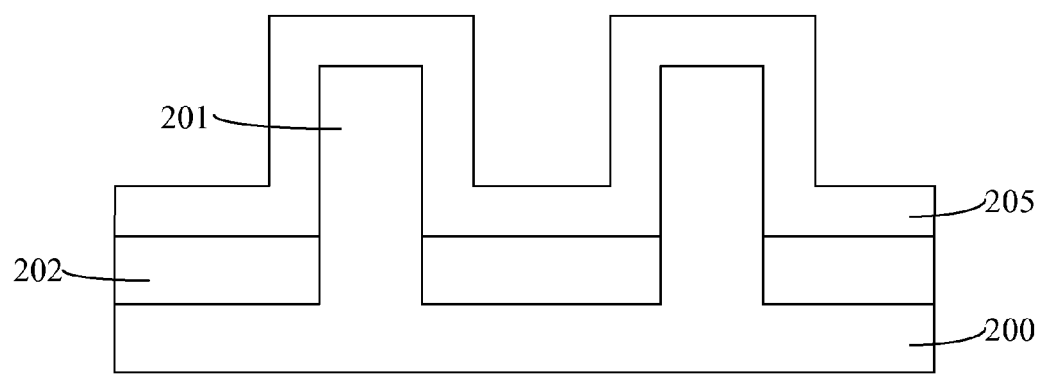

Returning to FIG. 13, after forming the gate structure, a barrier layer may be formed (S104). FIGS. 6~7 illustrate a corresponding semiconductor structure; and FIG. 7 is the cross-section view of the semiconductor structure illustrated in FIG. 6 along the "AA1" direction.

As shown in FIGS. 6~7, a barrier layer 205 is formed on the surface of the insulation layer 202, and the top and side surfaces of the fins 201. Further, the barrier layer 205 also covers the top and side surfaces of the gate structure.

Before subsequently forming stress layers by an epitaxial growth process, the portions of the barrier layer 205 on the top surfaces of the fins 201 may be removed to expose the top surfaces of the fins 201. The stress layers may be formed on the exposed top surfaces of the fins 201. Further, the portions of the barrier layer 205 formed on the side surfaces of the fins 201 may be kept. Thus, the stress layers may be prevented from being formed on the side surfaces of the fins 201; and the bridging issue of the stress layers may be avoided.

A top portion of the barrier layer 205 may be subsequently converted into a passive layer. Further, the barrier layer 205 and the passive layer may have an etching selectivity to a same etching process; and the material of the barrier layer 205 may have to be relatively easy oxidized.

In one embodiment, the barrier layer 205 may be made of silicon nitride. The barrier layer 205 may be subsequently oxidized. Because silicon atoms may be easier to bond with oxygen atoms than nitrogen atoms, it may be relatively easy to convert a portion of the barrier layer 205 made of silicon nitride into a passive layer. The passive layer may be silicon oxide, or silicon oxynitride. A same etching process may have different etching rates to silicon nitride, silicon oxide, or silicon oxynitride.

In certain other embodiments, the barrier layer 205 may be made of silicon oxynitride. Similarly, silicon atoms may be easier to bond with oxygen atoms than nitrogen atoms. Thus, it may be easy to convert a top portion of the barrier layer 205 made of silicon oxynitride into a passive layer made of silicon oxide during an oxidation process. A same etching process may have different etching rates to silicon oxynitride and silicon oxide.

The barrier layer 205 may be formed by any appropriate process, such as a CVD process, a PVD process, an ALD process, or an FCVD process, etc. In one embodiment, the barrier layer 205 is made of silicon nitride; and a CVD process is used to form the barrier layer 205.

With the continuous shrinking of semiconductor structures, the distance between adjacent fins 201 has become smaller and the smaller. Thus, it may be difficult to fill the barrier layer 205 in between the adjacent fins 201. If the barrier layer 205 is significantly thick, it may be easy for the top region of the adjacent fins 201 to be closed. Thus, the quality of the barrier layer 205 may be adversely affected. If the barrier layer 205 is substantially thin, it may increase the difficulty for subsequently converting a portion of the barrier layer 205 to a passive layer. Further, the remaining barrier layer 205 may also be substantially thin; and it may be unable to provide the side surfaces of the fins 201 with an enough protection. Therefore, the thickness of the barrier layer 205 may be in a range of approximately 20 Å-200 Å.

Figure 8:
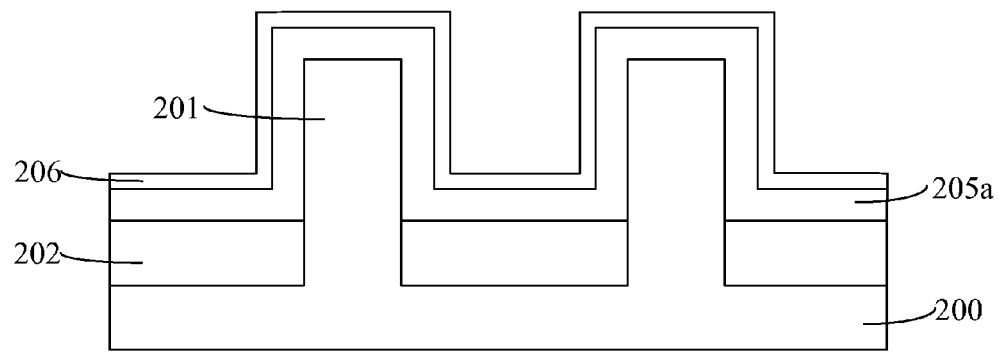

Returning to FIG. 13, after forming the barrier layer 205, a passive layer may be formed (S105). FIG. 8 illustrates a corresponding semiconductor structure.

As shown in FIG. 8, a passive layer 206 is formed. In one embodiment, the passive layer 206 may be formed by oxidizing a top portion of the barrier layer 205. The non-oxidized portion of the first barrier layer 205 may be referred as a remaining barrier layer 205a. The passive layer 206 may be used to subsequently form passive sidewalls on the remaining barrier layer 205a.

The remaining barrier layer 205a and the passive layer 206 may have different etching rates to a same etching process. Thus, when the passive sidewalls are subsequently formed by etching the passive layer 206, the remaining barrier layer 205a may not be damaged.

Specifically, when the portions of the passive layer 206 on the top of the fins 206 are subsequently removed, the top surface of the remaining barrier layer 205a may be exposed. Because the remaining barrier layer 205a and the passive layer 206 may have a relatively high etching selectivity, it may ensure that the etching process for subsequently forming the passive sidewalls may not damage the top surface of the remaining barrier layer 205a. Therefore, the portion of the remaining barrier layer 205a on the top surfaces of the fins 201 may be even and smooth. It may prevent a subsequent damage (etching) to the fins 201 caused by an uneven surface of the remaining barrier layer 205a on the top surfaces of the fins 201.

The process for oxidizing the barrier layer 205 may be referred as a radical oxidation process. The barrier layer 205 may be oxidized by any appropriate process, such as an in-situ steam generation (ISSG) process, an oxygen plasma doping process, or a slot plane antenna oxidation (SPA) process. In one embodiment, an ISSG process is used to oxidize the barrier layer 205 to convert a top portion of the barrier layer 205 to the passive layer 206. The reaction gas of the ISSG process may include $H_2$, $O_2$, or $N_2O$, etc. The flow rate of $H_2$ may be in a range of approximately 10 sccm~1000 sccm. The flow rate of $O_2$ or $N_2O$ may be in a range of approximately 20 sccm~2000 sccm. The pressure of the reaction chamber of the ISSG process may be in a range of approximately 0.1 Torr~20 Torr. The temperature of the reaction chamber may be in a range of approximately 450° C.~1100° C.

In certain other embodiments, an oxygen plasma implantation process may be used to oxidize the barrier layer 205 to convert a top portion of the barrier layer 205 to the passive layer 206. The temperature of the reaction chamber of the oxygen plasma implantation process may be in a range of 0~300° C. The pressure of the reaction chamber may be in a range of approximately 0.1 mTorr~20 mTorr. The power of the radio frequency plasma may be in a range of approximately 200 W~3500 W. The flow rate of $O_2$ may be in a range of approximately 50 sccm~1000 sccm.

The thickness of the passive layer 206 may be any appropriate value. If the passive layer 206 is significantly thick, the thickness of the remaining barrier layer 205a may be substantially thin. Thus, the portions of the remaining barrier layer 205a on the side surfaces of the fins 201 may provide substantially small protection to the fins 201. Further, it may be relatively difficult to form the passive layer 206 with a significantly large thickness. If the passive layer 206 is substantially thin, the protection effect of the subsequently formed passive sidewalls to the portions of the remaining barrier layer 205a on the fins 201 may be substantially small. When an etching process is subsequently used to remove the portions of the remaining barrier layer 205a on the top surfaces of the fins 201, it may be easy for the etching process to remove the subsequently formed passive sidewalls. Thus, the etching process may etch the remaining barrier layer 205a on the side surfaces of the fins 201; and the side surfaces of the fins 201 may be exposed before forming the stress layers. Therefore, the thickness of the passive layer 206 may be in a range of approximately 5 Å-50 Å.

In one embodiment, the barrier layer 205 is made of silicon nitride. After the radical oxidation process, a top portion of the barrier layer 205 may be converted to the passive layer 206. Silicon atoms and oxygen atoms may have a stronger bonding ability than silicon atoms and nitrogen atoms. Thus, the nitrogen-silicon bonds in the top portion of the barrier layer 205 may be broken; and rearranged to form silicon-oxygen bonds. The nitrogen atoms may be released from the nitrogen-silicon bonds to form free nitrogen atoms. The free nitrogen atoms may be expelled by the silicon-oxygen bonds; and may diffuse into the non-reacted barrier layer 205, i.e., the remaining barrier layer 205a. Thus, after the radical oxidation process, the nitrogen concentration of the remaining barrier layer 205a may be greater than the nitrogen concentration of the barrier layer 205 before the oxidation process. Therefore, the process for subsequently etching the passive layer 206 may have a lower etching rate to the remaining barrier layer 205a.

Therefore, after the radical oxidation process, the etching selectivity between the remaining barrier layer 205a and the passive layer 206 may be further improved. Thus, it may further prevent the remaining barrier layer 205a from being damaged by the process for subsequently etching the passive layer 206. Further, the smoothness and flatness of the remaining barrier layer 205a on the top surfaces of the fins 201 may be improved.

When the barrier layer 205 is made of silicon nitride, the passive layer 206 may be made of silicon oxide, or silicon oxynitride. In one embodiment, the barrier layer 205 is made of silicon nitride, the passive layer 206 is made of silicon oxide.

In certain other embodiments, when the barrier layer 205 is made of silicon oxynitride, the passive layer 206 is made of silicon oxide. Similarly, after the oxidation process, the nitrogen concentration in the remaining barrier layer 205a may be greater than the nitrogen concentration in the barrier layer 205 before the oxidation process. Thus, the etching selectivity between the remaining barrier layer 205a and the passive layer 206 may be further improved.

Further, referring to FIG. 8, by converting a portion of the barrier layer 205 to the passive layer 206 after forming the barrier layer 205, the interface between the remaining barrier layer 205a and the passive layer 206 may become denser. Thus, the quality of the subsequently formed passive sidewalls may be improved. Further, the protective effect of the subsequently formed passive sidewalls to the remaining barrier layer 205a may be increased. When the portions of the remaining barrier layer 205a on the top surfaces of the fins 201 are subsequently removed, the portions of the remaining barrier layer 205a on the side surfaces of the fins 201 may not be etched because of the protection of the subsequently formed passive sidewalls. Thus, the side surfaces of the fins 201 may not be exposed.

If a passive layer is directly formed on the barrier layer 205, the distance between two adjacent fins 201 may be reduced. Thus, the top portion of the trench between adjacent fins 201 may be easy to be closed during the process for forming the passive layer. Therefore, the quality of the passive layer may be affected. Further, when the passive layer is formed on the surface of the barrier layer 205, voids may be formed on the interface region between the passive layer and the barrier layer 205. Especially at the corner regions of the barrier layer 205, the possibility for forming voids may be greater. Thus, the interface region between the subsequently formed passive sidewalls and the barrier layer 205 may have voids inside. When the portions of the barrier layer 205 on the top surfaces of the fins 201 is removed, the voids may cause the barrier layer 205 on the side surfaces of the fins 201 to be etched.

Figure 9:
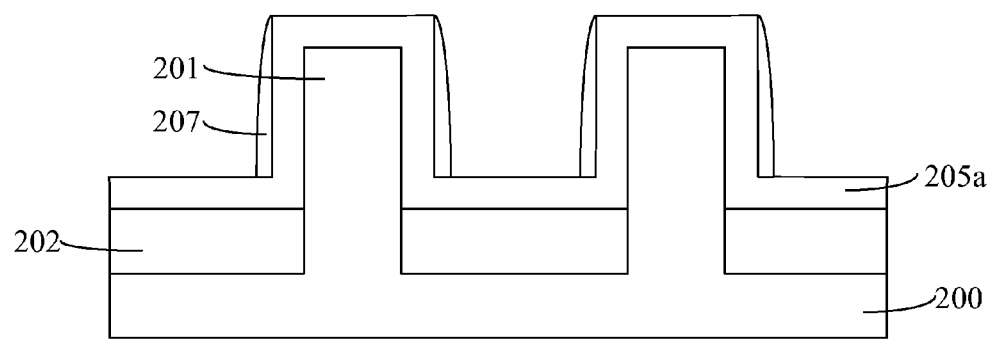

Returning to FIG. 13, after forming the passive layer 206, passive sidewalls may be formed (S106). FIG. 9 illustrates a corresponding semiconductor structure.

As shown in FIG. 9, passive sidewalls 207 are formed on the side surfaces of the remaining barrier layer 205a. The passive sidewalls 207 may be formed by performing an etch-back process (mask-less etching process) on the passive layer 206. The portion of the passive layer 206 on the top surface of the remaining barrier layer 205a is removed; and the portions of the remaining barrier layer 205a on the top surfaces of the fins 201 may be exposed.

The passive sidewalls 207 may cover the portions of the remaining barrier layer 205a on the side surfaces of the fins 201. The passive sidewalls 207 may protect the portions of the remaining barrier layer 205a on the side surfaces of the fins 201 during the subsequent process for removing the portions of the remaining barrier layer 205a on the top surfaces of the fins 201. Thus, it may prevent the stress layers from being formed on the side surfaces of the fins 201 during a process for forming the stress layers on the top surfaces of the fins 201.

The etch-back process may be any appropriate etching process, such as a dry etching process, a wet etching process, or an ion beam etching process, etc. In one embodiment, a dry etching process is used to etch the passive layer 206. Specifically, a reactive ion etching (RIE) process is used to etch the passive layer 206 to form the passive sidewalls 207.

The parameters of the RIE process may affect the etching results of the passive layer 206. If the output power of the plasma source of the etching chamber is substantially low, the content and the energy of the plasma may also be substantially low. Thus, it may take a relatively long time for the RIE process to remove the passive layer 206 on the top surface of the remaining barrier layer 205a. If the output power of the plasma source of the etching chamber is significantly high, the content and the energy of the plasma may also be substantially high. Thus, the etch rate of the RIE process to the passive layer 206 may be significantly high; and it may cause the passive sidewalls 207 to be substantially thin. Further, it may be easy to damage the portions of the remaining barrier layer 205a on the top surfaces of the fins 201.

Further, if the temperature of the substrate 200 is substantially low; and/or the pressure of the etching chamber is substantially low, the energy of the plasma may also be substantially low. Thus, it may have an adverse effect for improving the production efficiency. If the temperature of the substrate 200 is significantly high; and/or the pressure of the etching chamber is significantly high, it may cause the etching rate to be significantly high. Thus, it may adversely affect the portions of the remaining barrier layer 205a on the side surfaces of the fins 201.

Therefore, in one embodiment, the output power of the plasma of the etching chamber may be in a range of approximately 200 W~2000 W. The temperature of the substrate 200 may be in a range of approximately 20° C.~80° C. The pressure of the etching chamber may be in a range of approximately 5 mTorr~50 mTorr. The etching gas may include fluorine-contained gas, such as $CF_4$, or $CHF_3$, etc., or $Cl_2$, etc. The etching gas may also include $O_2$, or He, etc. Further, a protection gas, such as $N_2$, or Ar, etc., may be introduced into the etching chamber. The total flow rate of the etching gas and the protection gas may be in a range of approximately 40 sccm~80 sccm.

Such a RIE process may have a relatively high etching rate to silicon oxide; and a relatively low etching rate to silicon nitride. Thus, the passive layer 206 and the remaining barrier layer 205a may have a significantly high etching selectivity.

Further, in one embodiment, a portion of the barrier layer 205 may be converted to the passive layer 206; and the nitrogen concentration of the remaining barrier layer 205a may be higher than the nitrogen concentration of the barrier layer 205 before the oxidation process. Thus, the RIE process may only have a substantially small etching rate to the remaining barrier layer 205a on the top surfaces of the fins 201, or may be omitted. The damage to the portions of the remaining barrier layer 205 on the top surfaces of the fins 201 caused by the RIE process may be further reduced. Therefore, the surfaces of the remaining barrier layer 205a on the top surfaces of the fins 201 may be relatively smooth; and the quality of the top surfaces of the fins 201 may not be adversely affected after the subsequent etching processes.

If the dry etching process etches the portions of the remaining barrier layer 205a on the top surfaces of the fins 201, the dry etching process may have different etching rates to the portions of the remaining barrier layer 205a on top surfaces of the fins 201 because of the blocking effect of the passive sidewalls 207. Thus, the thickness of the portions of the remaining barrier layer 205a on the top surfaces of the fins 201 may be uneven after the dry etching process. When the portions of the remaining barrier layer 205a on the top surfaces of the fins 201 are subsequently removed, the top surfaces of the fins 201 may be etched because of the unevenness of the top surfaces of the remaining barrier layer 205a. For example, "V" shaped trenches may be formed on the top surfaces of the fins 201. The "V" shaped trenches may adversely affected the quality of the subsequently formed stress layers (e-SiGe, or e-SiC, etc). Thus, the performance of the FinFETs may be affected.

Figure 10:
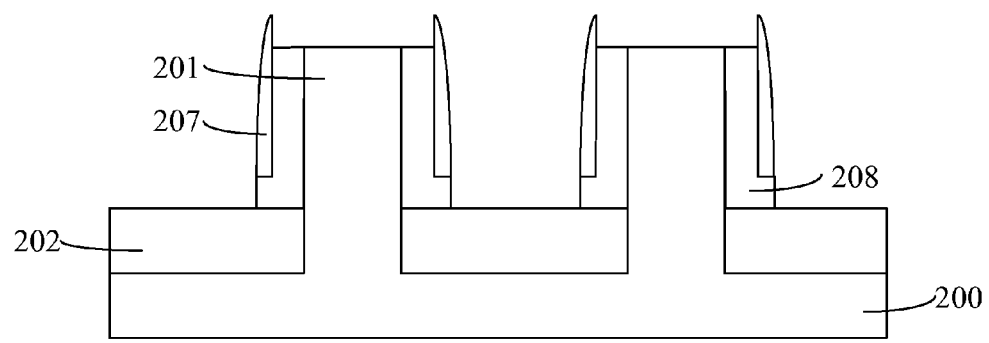

Returning to FIG. 13, after forming the passive sidewalls 207, the portions of the remaining barrier layer 205a on the top surfaces of the fins 201 may be removed (S107). FIG. 10 illustrates a corresponding semiconductor structure.

As shown in FIG. 10, the portions of the remaining barrier layer 205a on the top surfaces of the fins 201 are removed. Thus, the top surfaces of the fins 201 are exposed; and the portions of the remaining barrier layer 205a on the side surfaces of the fins 201 may be used as barrier sidewalls 208. Further, the portions of the remaining barrier layer 205a on the surface of the insulation layer 202 may also be removed. Further, the portions of the remaining barrier layer 205a on the side surfaces of the gate structure (not shown) may be portions of the barrier sidewalls 208.

The barrier sidewalls 208 may be formed by etching the portions of the remaining barrier layer 205a on the top surfaces of the fins 201 using the passive sidewalls 207 as an etching mask. Various processes may be used to etch the portions of the remaining barrier layer 205a on the top surfaces of the fins 201, such as a dry etching process, a wet etching process, or an ion beam etching process, etc.

In one embodiment, a wet etching process is used to etch the portions of the remaining barrier layer 205a on the top surfaces of the fins 201. The wet etching process may be an anisotropic wet etching preprocess. The wet etching process may have a uniform etching rate to the portion of remaining barrier layer 205a on the top surfaces of the fins 201. Further, comparing with a dry etching process, the etching rate of the wet etching process to the remaining barrier layer 205a on the top surfaces of the fins 201 may not be affected by the passive sidewalls 207. Thus, the uniformity of the etching process to the portions of the remaining barrier layer 205a on the top surfaces of the fins 201 may be further improved. That is, the top surfaces of the fins 201 may be even and smooth after removing the portion of the remaining barrier layer 205a on the top surfaces of the fins 201; and no "V" shaped trenches may be formed in the top surfaces of the fins 201.

The etching solution of the wet etching process may include any appropriate chemicals, such as a $NH_4OH$ and $H_2O_2$ solution (may be referred as a SC1 solution), a $H_2SO_4$ and $H_2O_2$ solution (may be referred as a SPAM solution), an HCl and $H_2O_2$ solution (may be referred as an HPM solution), or a $H_3PO_4$ solution, etc. The etching solution may be selected according to the material of the passive sidewalls 207 and the material of the remaining barrier layer 205a such that the remaining barrier layer 205a may have a significantly high etching selectivity to the passive sidewalls 207.

In one embodiment, the remaining barrier layer 205a is made of silicon nitride; and the passive layer 207 is made of silicon oxide. Thus, an $H_3PO_4$ solution may be used to etch the remaining barrier layer 205a on the top surfaces of the fins 201.

The top surfaces of the fins 201 may be used as an etching stop layer of the wet etching process. That is, when the top surfaces of the fins 201 are exposed, the wet etching process may be stopped. During the wet etching process, the portions of the surface of the remaining barrier layer 205 on the top surfaces of the fins 201 may well contact with the etching solution. Further, the passive sidewalls 207 may not affect the etching ability of the etching solution contacting with the remaining barrier layer 205a. Thus, the etching solution may have a uniform etching rate to all the portions of the remaining barrier layer 205a on the top surfaces of the fins 201. Further, referring to FIG. 10, under the protection of the passive sidewalls 207, the portions of the remaining barrier layer 205 on the top surfaces of the fins 201 may only be etched from the top surfaces of the remaining barrier layer 205a to the top surfaces of the fins 201 until the top surfaces of the fins 201 are exposed. Further, the wet etching process may have a relatively high etching selectivity. Thus, the damage to the top surfaces of the fins 201 may be substantially small. Therefore, the exposed top surfaces of the fins 201 may be relatively smooth and even; and no "V" shape trenches may be formed in the top surfaces of the fins 201. The smooth and even top surfaces of the fins 201 may aid the subsequent formation of high quality stress layers (e-SiGe, or e-SiC, etc) on the top surfaces of the fins 201.

Further, the nitrogen concentration of the remaining barrier layer 205a may be relatively high, the process for etching the passive layer 206 may have a substantially low etching rate to the remaining barrier layer 205a. After forming the passive sidewalls 207, the surfaces of the portions of the remaining barrier layer 205a on the top surfaces of the fins 201 may be relatively smooth. Thus, the wet etching process for removing the remaining barrier layer 205a on the top surfaces of the fins 201 may stop at uniform positions of the top surfaces of the fins 201. Thus, it may improve the flatness of the top surfaces of the fins 201.

In one embodiment, the portions of the remaining barrier layer 205a on the top surfaces of the fins 201, the portion of the remaining barrier layer 205a on the insulation layer 202, and the portions of the remaining barrier layer 205a on the top surface of the gate structure (not shown) may be removed simultaneously. Thus, the surface of the insulation layer 202 may be exposed. In certain other embodiments, after removing the portions of the remaining barrier layer 205a on the top surfaces of the fins 201, there may be still a portion of the remaining barrier layer 205a left on the surface of the insulation layer 202 and the surface of the gate structure.

Returning to FIG. 13, after removing the portions of the remaining barrier layer 205a on the top surfaces of the fins 201, the passive sidewalls 207 may be removed (S108). FIG. 11 illustrates a corresponding semiconductor structure.

As shown in FIG. 11, the passive sidewalls 207 are removed. Various processes may be used to remove the passive sidewalls 207, such as a dry etching process, a wet etching process, or an ion beam etching process, etc. In one embodiment, the passive sidewalls 207 are removed by a wet etching process.

The etching solution of the wet etching process may include an HF solution, a $NH_4OH$ and $H_2O_2$ solution, or a $H_2SO_4$ and $H_2O_2$ solution, etc. The etching solution may be chosen according to the material of the barrier sidewalls 208 and the material of the passive sidewalls 207. Specifically, the etching solution may have a significantly high etching selectivity between the passive sidewalls 207 and the barrier sidewalls 208. Thus, it may avoid damaging the barrier sidewalls 208 on the side surfaces of the fins 201 during the process for removing the passive sidewalls 207.

In one embodiment, the barrier sidewalls 208 are made of silicon nitride. The passive sidewalls 207 are made of silicon oxide. Thus, an HF solution is used to remove the passive sidewalls 207.

Returning to FIG. 13, after removing the passive sidewalls 207, stress layers may be formed (S109). FIG. 12 illustrates a corresponding semiconductor structure.

As shown in FIG. 12, stress layers 209 are formed on the top surface of each of the fins 201. The stress layers 209 may be formed on the top surfaces of the fins 201 at both sides of the gate structure (not shown).

In one embodiment, when the FinFETs are PMOS devices, the stress layers 209 may be made of SiGe, or SiGeB, etc. The stress layers 209 may be able to generate a compressive stress to the portions of the fins 201 under the gate structure. The portions of the fins 201 under the gate structure may be configured as the channel regions of the P-type FinFETs. Thus, the compressive stress may increase the hole mobility of the channel regions of the FinFETs; and the performance of the P-type FinFETs may be improved.

In certain other embodiments, when the FinFETs are NMOS devices, the stress layers 209 may be made of SiC, or SiCP, etc. The stress layers 209 may be able to generate a tensile stress to the portions of the fins 201 under the gate structure. The portions of the fins 201 under the gate structure may be configured as the channel regions of the N-type FinFETs. Thus, the tensile stress may increase the electron mobility of the channel regions of the FinFETs; and the performance of the N-type FinFETs may be improved.

The stress layers 209 may be formed by any appropriate process, such as a CVD process, a PVD process, an ALD process, or an FCVD process, etc. In one embodiment, the stress layers 209 are formed on the surfaces of the fins 201 by a selective epitaxial growth process.

For illustrative purposes, a process for forming the stress layers 209 made of SiGe is described. The temperature of the selective epitaxial growth process may be in a range of approximately 600° C.~1100° C. The pressure may be in a range of approximately 1 Torr~500 Torr. The reaction gas may include a silicon source gas, and a germanium source, etc. The silicon source gas may include $SiH_4$, or $SiHCl_2$, etc. The germanium source gas may include $GeH_4$, etc. The reaction gas may also include HCl, and $H_2$, etc. The flow rate of the silicon source gas may be in a range of approximately 1 sccm~1000 sccm. The flow rate of the germanium source gas may be in range of approximately 1 sccm~1000 sccm. The flow rate of HCl may be in a range of approximately 1 sccm~1000 sccm. The flow rate of $H_2$ may be in a range of approximately 0.1 slm~50 slm.

Referring to FIG. 12, because SiGe may have different growth rates along different crystal orientations, the cross-section of the stress layers 209 may be hexagonal shaped. Further, the top surfaces of the fins 201 may be relatively smooth and even. Thus, the quality of the stress layers 209 may match the desired requirements.

In certain other embodiments, after removing the portions of the remaining barrier layer 205a on the top surfaces of the fins 201, the passive sidewalls 207 may be removed. Then, trenches may be formed in the exposed surfaces of the fins 201 between adjacent barrier sidewalls 208 by etching the fins 201. Further, stress layers may be formed in the trenches. The stress layers made of SiGe formed by such as process may be referred as the e-SiGe structures. Thus, the distance between the stress layers and the channel regions under the gate structure may be reduced. Therefore, the stress applied on the channel regions by the stress layers may be increased; and the performance of the FinFETs may be further improved.

Further, the stress layers 209 may be doped with any appropriate ions. In one embodiment, the doping ions may be P-type ions, such as B ions, Ga ions, or In ions, etc. The ions may be doped by any appropriate process, such as an ion implantation process, or an in situ doping process, etc. In one embodiment, the P-type ions are doped by an in situ doping process. That is, a doping gas may be introduced during the process for forming the stress layers 209. Thus, the doped stress layers 209 may be formed. The doped stress layers 209 may be configured as the source/drain regions of the FinFETs.

In certain other embodiments, the stress layers 209 may be made of SiC. Thus, the stress layers 209 may be doped with N-type ions, such as P ions, As ions, or Sb ions, etc. The N-type ions may be doped by an in situ doping process, or an ion implantation process, etc.

Thus, a semiconductor structure having a plurality of FinFETs may be formed by the above disclosed processes and methods; and the corresponding semiconductor structure is illustrated in FIG. 12. As shown in FIG. 12, the semiconductor structure includes a substrate 100; and a plurality of fins 201 formed on the surface of the substrate. The semiconductor structure also includes an insulation layer 202 formed on the surface of the substrate 200 between adjacent fins 201; and barrier sidewalls 208 formed on the side surfaces of the fins 201. Further, the semiconductor structure includes a gate structure (not shown) overlying on the fins 201 formed on the insulation layer 202; and stress layers 209 formed on the fins 201 at both sides of the gate structure. The detailed structures and intermediate structures are described above with respect to the fabrication processes.

According to the disclosed methods and structures, after forming the barrier layer on the top and side surfaces of the fins, a portion of the barrier layer be converted into a passive layer by a radical oxidation process. Then, an etch-back process may be performed on the passive layer to form passive sidewalls covering the remaining barrier layer on the side surfaces of the fins. Further, the remaining barrier layer on the top surfaces of the fins may be removed by a wet etching process; and the remaining barrier layer on the side surfaces of the fins may be kept as a portion of the barrier sidewalls. Because the side surfaces of the remaining barrier layer may protected by the passive layer, the remaining barrier layer on the top surfaces of the fins may only be etched from the top surfaces of the remaining barrier layer to the top surfaces of the fins until the top surfaces of the fins are exposed. Further, the during the wet etching process, the remaining barrier layer on the top surfaces of the fins may well contact with the etching solution; and the passive sidewalls may not affect the etching ability of the etching solution contacting with the remaining barrier layer. Thus, the etching solution of the wet etching process may have uniform etching rate to all the portions of the remaining barrier layer on the top surfaces of the fins. Further, the wet etching process may have a significantly high etching selectivity. Thus, the damage to the top surfaces of the fins may be significantly small; and the top surfaces of the fins may be significantly smooth and even; and no "V" shape trenches may be formed. The smoothness of the top surfaces of the fins may aid to subsequent form stress layers having a desired quality on the top surfaces of the fins; and improve the electrical properties of the fins.

Further, by converting a portion the barrier layer into the passive layer, the remaining barrier layer and the passive layer may have a desired interface; and it may prevent forming voids between the remaining barrier layer and the passive layer. Thus, the passive sidewalls formed from the passive layer may also have a significantly strong bonding with the remaining barrier layer; and voids in the interface region between the passive sidewalls and the remaining barrier layer may also be prevented. When the passive sidewalls are used as an etching mask for etching the portions of the remaining barrier layer on the top surfaces of the fins, it may prevent the etching solution from contacting with the portions of the remaining barrier layer on the side surfaces of the fins through the voids. Thus, it may prevent the portions of the remaining barrier layer on the side surfaces of the fins from being etched. If the portions of the remaining barrier layer on the side surfaces of the fins are etched, the side surfaces of the fins may be exposed. Further, if the side surfaces of the fins are exposed, the subsequently formed stress layer may also be formed on the side surfaces of the fins. Thus, the bridging issue may happen. Therefore, the disclosed method may prevent the stress layers from being formed on the side surfaces of the fins; and the performance of the FinFETs may be improved.

Further, the barrier layer may be made of a material containing nitrogen atoms. For example, the barrier layer may be made of silicon nitride; or silicon oxynitride, etc. When a portion of the barrier layer is oxidized to form the passive layer, because the silicon atoms may be easier to bond with oxygen atoms than to bond with nitrogen atoms, the nitrogen-silicon bonds may be broken to release free nitrogen atoms and silicon bonds. The broken silicon bonds may bond with the oxygen atoms to form silicon-oxygen bonds. The free nitrogen atoms may diffuse into the remaining barrier layer having the silicon-nitrogen bonds under the expelling of the silicon-oxygen bonds. Thus, the remaining barrier layer may have a higher nitrogen concentration after the oxidation process. When an etch-back process is used to subsequently etch the passive layer, because the nitrogen concentration of the remaining barrier layer may be relatively high, the etching process may have a significantly low etching rate to the remaining barrier layer. Thus, the portions of the remaining barrier layer on the top surfaces of the fins may not be etched after the etch-back process; and the thickness of the portions of the remaining barrier layer on the top surfaces of the fins may be uniform. Therefore, the portions of the remaining barrier layer on the top surfaces of the fins may be removed simultaneously by an etching process; and it may further prevent the top surfaces of the fins from being damaged. Thus, the quality of the top surfaces of the fins may be further improved; and the performance of the FinFETs may be further enhanced.

Further, if the barrier layer is significantly thick, it may be easy for the barrier layer to close the top region of the trenches between the adjacent fins. Thus, the quality of the barrier layer may be adversely affected. If the barrier layer is substantially thin, it may increase the technical difficulties of the subsequent oxidation process. Further, it may cause the subsequently formed remaining barrier layer not to be able to protect the side surfaces of the fins. Therefore, in the disclosed embodiments, the thickness of the barrier layer may be in a range of approximately 20 Å-200 Å. Such a thickness may ensure the barrier layer to have a desired quality. Further, it may also ensure the portions of the remaining barrier on the side surfaces of the fins to have a significantly strong protection to the fins after forming the passive layer.

Further, if the passive layer is significantly thick, the remaining barrier layer may be substantially thin. The protection effect of the remaining barrier layer to the side surfaces of the fins may be substantially weak. Further, it may be difficult to oxidize the barrier layer to form the passive layer. If the passive layer is substantially thin, the protection effect of the subsequently formed passive sidewalls to the portions of the remaining barrier layer on the side surfaces of the fins may be substantially small. Thus, when the portions of the remaining barrier layer on the top surfaces of the fins are subsequently removed, the etching process may etch and remove the passive sidewalls. Further, the etching process may etch the portions of the remaining barrier layer on the side surfaces of the fins. Thus, the side surfaces of the fins may be exposed before forming the stress layers. Therefore, in the disclosed embodiments, the thickness of the passive layer may be in a range of approximately 5 Å-50 Å. Such a thickness may ensure the passive layer to well protect the portions of the remaining barrier layer on the side surfaces of the fins.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating FinFETs, comprising:
   providing a substrate;
   forming a plurality of fins on a surface of the substrate;
   forming a gate structure overlying on at least one of the plurality of fins;
   forming a barrier layer covering top and side surfaces of the gate structure, and top and side surfaces of exposed portions of the plurality of fins;
   performing a radical oxidation process to convert a surface portion of the barrier layer to a passive layer over a remaining portion of the barrier layer and to cause top surfaces of the fins to remain to be flat after subsequent etching processes including an etch-back process and a wet etch process;
   performing the etch-back process on the passive layer to form passive sidewalls on sidewall surfaces of the remaining portion of the barrier layer on the side surfaces of the fins; and
   removing portions of the remaining portion of the barrier layer on the top surfaces of the fins by the wet etching process using the passive sidewalls as an etching mask.

2. The method according to claim 1, after removing the portions of the remaining portion of the barrier layer on the top surfaces of the fins, further including:
   removing the passive sidewalls; and
   forming stress layers on the plurality of fins.

3. The method according to claim 2, wherein:
   the passive sidewalls are removed by a wet etching process; and
   the stress layers are formed by one of a selective epitaxial growth process and an embedding process.

4. The method according to claim 1, wherein:
   the etching solution of the wet etching process is one of a $H_2SO_4$ and $H_2O_2$ solution (SPM), a HCl and $H_2O_2$ solution (HPM), and a $NH_4OH$ and $H_2O_2$ solution (SC1).

5. The method according to claim 1, wherein:
the barrier layer is made of silicon nitride.

6. The method according to claim 5, wherein:
the passive layer is made of one of silicon oxide and silicon oxynitride.

7. The method according to claim 6, wherein:
a nitrogen concentration of the remaining portion of the barrier layer is greater than a nitrogen concentration of the barrier layer before the oxidation process.

8. The method according to claim 1, wherein:
the barrier layer is made of silicon oxynitride.

9. The method according to claim 8, wherein:
the passive layer is made of silicon oxide.

10. The method according to claim 1, after forming the plurality of fins, further including:
forming a dielectric layer on the surface of the substrate.

11. The method according to claim 1, wherein:
the radical oxidation process is one of an in situ steam generation (ISSG) process, an oxygen plasma doping process, and a slot plane antenna oxidation (SPA) process.

12. The method according to claim 11, wherein:
reaction gases of the ISSG process include $H_2$, $O_2$ or $N_2O$;
a flow rate of $H_2$ is in a range of approximately 10 sccm~1000 sccm;
a flow rate of $O_2$ or $N_2O$ is in a range of approximately 20 sccm~2000 sccm;
a pressure of a reaction chamber of the ISSG process is in a range of approximately 0.1 Torr~20 Torr; and
a temperature of the reaction chamber of the ISSG process is in a range of approximately 450° C.~1100° C.

13. The method according to claim 1, wherein:
the etch-back process is a reactive ion etching (RIE) process;
an output power of an etching chamber of the RIE process is in a range of approximately 200 W~2000 W;
a temperature of the substrate is in a range of approximately 20° C.~80° C.;
a pressure of the etching chamber is in a range of approximately 5 mTorr~50 mTorr;
an etching gas of the RIE process includes one of fluorine-contained gas and chlorine gas;
a protection gas of the RIE process includes one of argon and helium; and
a total flow rate of the etching gas and the protection gas of the RIE process is in a range of approximately 40 sccm~800 sccm.

14. The method according to claim 1, wherein:
a thickness of the barrier layer is in a range of approximately 20 Å~200 Å.

15. The method according to claim 14, wherein:
a thickness of the passive layer is in a range of approximately 5 Å~50 Å.

16. A semiconductor structure having a plurality of FinFETs, comprising:
a semiconductor substrate; a plurality of fins formed on a surface of the substrate; barrier sidewalls formed on side surfaces of the fins; a gate structure overlying on at least one of the plurality of fins formed; and stress layers formed on each of the plurality of fins at both sides of the gate structure,
wherein the barrier sidewalls are formed by the method according to claim 1.

17. The semiconductor structure according to claim 16, wherein:
the passive layer is made of silicon oxide; and
a thickness of the passive layer is in a range of approximately 5 Å~30 Å.

18. The semiconductor structure according to claim 16, wherein:
the stress layers are made of one of SiGe, SiGeB, SiC, and SiCP.

* * * * *